United States Patent [19]

Eriksson et al.

[11] Patent Number: 4,880,395
[45] Date of Patent: Nov. 14, 1989

[54] CONTACT ON TEST SWITCH

[75] Inventors: Rolf Eriksson; Gudmar Hammarlund, both of Västerås; Lars-Erik Sundqvist, Örebro, all of Sweden

[73] Assignee: Asea Brown Boveri AB, Västerås, Sweden

[21] Appl. No.: 282,273

[22] Filed: Dec. 9, 1988

[30] Foreign Application Priority Data

Dec. 15, 1987 [SE] Sweden ............................ 8705000

[51] Int. Cl.⁴ ..................... H01R 31/08; H01R 13/00; H01R 25/00
[52] U.S. Cl. ...................................... 439/507; 439/48; 439/115; 439/483; 439/912
[58] Field of Search ................... 439/54, 94, 115, 116, 439/219, 259, 265, 266, 268, 374, 483, 484, 507–511, 514, 515, 655, 656, 676, 908, 912

[56] References Cited

U.S. PATENT DOCUMENTS

| | | | |
|---|---|---|---|
| 2,664,544 | 12/1953 | Caplis | 439/912 |
| 3,696,296 | 10/1972 | Nylen | 324/158 P |
| 3,997,234 | 12/1976 | Worman | 439/483 |
| 4,582,383 | 4/1986 | Jo et al. | 439/48 |
| 4,735,574 | 4/1988 | Beaulieu et al. | 439/507 |
| 4,795,355 | 1/1989 | Dorn et al. | 439/115 |

FOREIGN PATENT DOCUMENTS 3121964 12/1982 Fed. Rep. of Germany ...... 439/507

OTHER PUBLICATIONS

ABB Relays, Pamphlet No. B03-9510E, Jan. 1985.

Primary Examiner—P. Austin Bradley
Attorney, Agent, or Firm—Watson, Cole, Grindle & Watson

[57] ABSTRACT

The present invention relates to a test system for a protective relay. The test system comprises a test switch (1) and a test-plug handle (2). The invention comprises supplementing the system with a contact function which is activated when the handle is inserted into the test switch so that, before the testing of the relays in the protective device is initiated, a signal function can be obtained to indicate that testing is in progress. The contact function is brought about by arranging, on the upper and/or lower side(s) of the test switch, two semi-protected, uninsulated and parallel contact pins/slide bars (4, 5) from the front edge to the rear edge of the test switch. At the rear edge contact parts to ordinary conductors are arranged in order to forward the contact function. The contact pins are mounted in a guide structure (10, 11) formed with an inner guide profile adapted to guide two resilient tongues (13, 14) on the test-plug handle. On the sides of the tongues facing the test switch, these tongues are each provided with a contact washer. The parts included cooperate in such a way that, once the test-plug handle has been inserted into the test switch, contact is achieved between the two contact pins on the upper and/or lower side(s) of the test switch.

5 Claims, 1 Drawing Sheet

U.S. Patent
Nov. 14, 1989
4,880,395
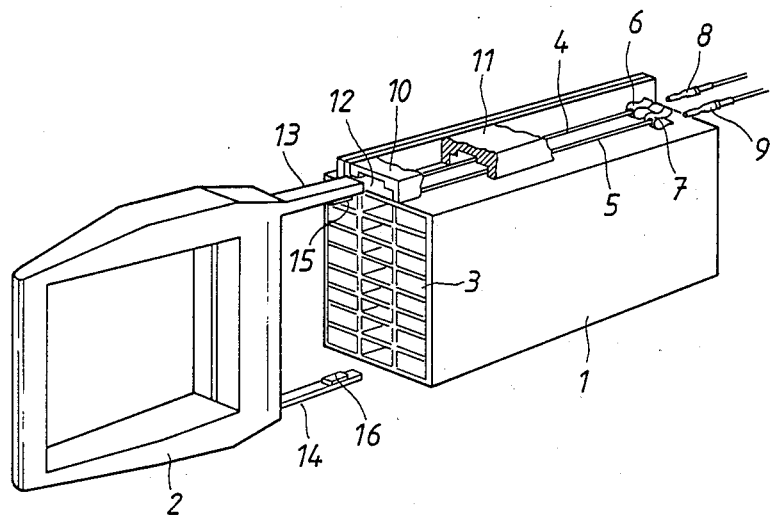

CONTACT ON TEST SWITCH

TECHNICAL FIELD

The present invention relates to a relay test system which is necessary for most more or less extensive protective relay systems. Protective relays normally comprise both voltage and current measuring functions. When testing the measuring members for these functions and the tripping relays, it is important to ensure that the protective system does not interpret the testing as a fault. Therefore, a test system must comprise means for uninterrupted switching, bypassing when testing a current relay, blocking possibilities when testing a tripping relay, etc. In practice, it has been found that there is a need for some form of indication that testing is in progress, and the invention is a solution to that problem.

BACKGROUND ART, THE PROBLEM

Swedish Pat. No. 341,956 ("Mechanism for testing protective relays and automatic equipment") and ABB Relay's pamphlet B03-9510E described in detail a relay test system according to the above. It comprises a fixed test switch with room for a plurality of contact units for different test functions. The test switch is suitably mounted in the frame in which the relays of the protective relay system are mounted. Depending on the functions in question, connection is performed from the relays of the protective system to the contacts on the rear side of the test switch for connection to the respective contact unit.

The test system further comprises a movable test-plug handle which is provided with test plugs adapted, after having been inserted into the different contact units, to perform the function of the contact unit in question. When the handle is inserted into the test switch, it is guided by two resilient tongues. Associated with the test-plug handle are also connectible leads for supply and measurement of the relays, the state of which is to be checked.

Otherwise, the test system also comprises certain other parts, such as a block-plug handle, plugs for different functions, etc., which do not require description in order to describe the invention.

As will have been clear from the above, in a protective relay with a test switch the circuits for tripping of circuit-breakers etc. extend via the test switch in order to be disconnected there when the test-plug handle is inserted into the test switch, i.e. when the protective system is to be tested. This enables testing, which is a fault simulation involving a study of the output signals of the protective relay, to be performed without, for example, a circuit-breaker tripping.

As indicated by way of introduction, however, in certain situations problems may arise which could be prevented if an external indication that relay testing is in progress is available.

In this connection, it is highly desirable to obtain this information before the test process is started. At the same time it is also desirable that initiation of this information takes place immediately before the start of the testing. What is possible to achieve in this respect is a situation where the information is generated as the test-plug handle is insertd into the test switch, however with the above reservation, i.e. that the information is obtained before the test process is started. A device acocordng to the invention covers both of these desired objects.

There are several reasons for the need of information that testing is in progress. Electric power distribution systems are often designed in such a way that there is a central power supply board and a works management responsible for a plurality of unmanned distribution stations. If protective relays in any of these normally unmanned stations are to be tested as regards, for example, overcurrent, undervoltage, blocking function, etc., in recent coordinated protective relay systems a signal indicating overcurrent, undervoltage, etc. is often transmitted via special communication links between the electronics of the protective relays and from the protective relays to other control equipment. The information in these links is digital and sometimes optical and cannot, therefore, pass via the test switch and be disconnected during testing. The consequence of this is that the information indicates a fault which the protective relay attemps to act upon, when, as a matter of fact, it is a question of testing in progress.

DISCLOSURE OF THE INVENTION

The desire to obtain a signal function indicating that testing is in progress can be fulfilled by arranging, on the upper and/or lower side(s) of the test switch, two semi-protected, uninsulated, parallel contact pins, isolated from each other, which are designed as slide bars and extend from the front edge of the test switch to its rear edge. At the rear edge there is arranged, for each contact pin, a connection device for transition to a common conductor. The contact pins and the connection device are mounted in a guide arrangement which constitutes semi-protection for the contact pins and which is designed with an inner guide profile, as will be clear from the following description.

According to the invention, the guiding, resilient tongues of the test-plug handle are replaced by two resilient tongues having a sectional area corresponding to the internal guide profile of the guide arrangement. On that side of each tongue which faces the contact pins/slide bars, a contact washer is attached. The contact pins, the guides, the tongues and the contact washer are adapted to cooperate in such a way that, as soon as the test-plug handle is inserted into the test switch, contact will be achieved between the two contact pins. In that way, a signal function indicating that testing is in progress can also be obtained immediately prior to the actual test process.

By using a contact according to the invention, which informs the electronics in the protective relay that the test-plug handle is inserted, a fault situation and a test situation can be distinguished, whereby the correct information can be conveyed via the communication links.

BRIEF DESCRIPTION OF THE DRAWING

The accompanying FIGURE shows an embodiment of a protective relay test system comprising a test switch and a test-plug handle with the necessary means for achieving a contact function according to the invention.

DESCRIPTION OF THE PREFERRED EMBODIMENTS

The accompanying single FIGURE shows a test switch 1 and a test-plug handle 2. The front side of the test switch 1 is provided with compartments for the various contact units, one such compartment being indicated at 3. As previously mentioned, the test switch 1 is normally mounted in a frame together with the frame-mounted relays of the protective system. Mounting parts for the test switch 1 are not shown in the FIGURE.

On the upper side of the test switch 1, the two contact pins 4 and 5 are mounted. These contact pins 4, 5 function as sliding contact bars. At the rear side of the test switch 1, the contact pins 4, 5 are provided with connection parts 6 and 7 for connection of conductors with corresponding connection parts 8 and 9. A similar connection pin and connection arrangement may also be provided on the underside of the test switch 1. Connection pins and connections are mounted in a guide structure, as is clear from the section parts 10 and 11. The guide, which is formed as semi-protection for the connection pins, has a special inner guide profile 12 which is adapted to guide the tongues 13 and 14 of the test-plug handle 2. At their front edges and on their sides facing the test switch 1, the tongues 13, 14 are each provided with a contact washer 15 and 16. Once the tongues 13, 14 of the test-plug handle 2 have been inserted into the guides of the test switch 1, the final contact between the two contact pins 4, 5, which is necessary for the desired signal function, is formed.

From the design point of view, there are several different ways of achieving the desired function. A preferred embodiment of that part which belongs to the test switch 1 comprises moulding the guiide in plastic together with a plate which, with the aid of rivets or otherwise, is attached to the upper and lower sides of the test switch. The guide itself is designed such that contact pins and contact parts can be inserted in a very simple manner into the guide and be snapped thereto. An alternative embodiment comprises casting the guide as an integral part of the test switch housing.

Several different embodiments of the resilient tongues of the test-plug handle are also available. In a preferred embodiment the tongues are cast as an integral part of the test-plug handle. Another embodiment entails screwing the tongues to the test-plug handle after having cast each part separately.

The contact washers of the tongues are fastened by different means and methods. The preferred embodiment entails snap-mounting them, possibly fixing them with pins to the tongues. Of primary importance for the performance of the contact function is that a suitable guide fit between tongues and guides is obtained.

We claim:

1. A device for achieving a contact function in a protective relay test system, said system comprising a test switch with compartments for different contact units and a test-plug handle with contact pins for activating the function of the contact units and adapted for insertion into the test switch, wherein each of the upper and/or lower side of the test switch is provided with two uninsulated, parallel contact pins/slide bars extending from the front edge of the test switch to its rear edge and each being provided at its rear edge with connection parts for transition to a common conductor, the contact pins/slide bars and the connection parts being mounted in a guide structure having an inner guide profile adapted for guiding resilient tongues arranged on the test-plug handle, each of said tongues, on that side facing the contact pins, being provided with a contact washer, and wherein contact pins, guides, tongues and contact washers cooperate in such a way that, once the test-plug handle has been inserted into the test switch, contact is made between the two contact pins/slide bars on the upper and/or lower side(s) of the test switch.

2. A device for achieving a contact function in a protective relay test system according to claim 1, wherein guides with contact pins/slide bars and connection parts are mounted on a plate arranged on the upper and/or lower side(s) of the test switch.

3. A device for achieving a contact function in a protective relay test system according to claim 1, wherein guides with contact pins/slide bars and connection parts are mounted as an integral part of the upper and/or lower side(s) of the test switch.

4. A device for achieving a contact function in a protective relay test system according to claim 1, wherein the two tongues of the test-plug handle are arranged as integral parts of the handle.

5. A device for achieving a contact function in a protective relay test system according to claim 1, wherein the two tongues are arranged as separate tongues attached to the test-plug handle.

* * * * *